Feb. 21, 1967 T. W. PARSONS ETAL 3,305,790

COMBINATION HALL-EFFECT DEVICE AND TRANSISTORS

Filed Dec. 21, 1962 2 Sheets-Sheet 1

THOMAS W. PARSONS
ZIEMOWIT R. S. RATAJSKI
*INVENTORS*

BY S. A. Giarratana
Francis L. Masselle
*ATTORNEYS*

Feb. 21, 1967 T. W. PARSONS ETAL 3,305,790

COMBINATION HALL-EFFECT DEVICE AND TRANSISTORS

Filed Dec. 21, 1962

2 Sheets-Sheet 2

THOMAS W. PARSONS
ZIEMOWIT R. S. RATAJSKI
*INVENTORS*

BY S. A. Giarratana
Francis L. Masselle
*ATTORNEYS*

3,305,790

COMBINATION HALL-EFFECT DEVICE AND TRANSISTORS

Thomas W. Parsons, Brooklyn, N.Y., and Ziemowit R. S. Ratajski, Cedar Grove, N.J., assignors to General Precision Inc., Little Falls, N.J., a corporation of Delaware Filed Dec. 21, 1962, Ser. No. 246,399
15 Claims. (Cl. 330—6)

This invention relates to Hall generators and more particularly to a combination Hall generator and amplifier to amplify the voltage produced by the Hall generator, both devices being constructed and functioning substantially as a single unit.

In previous Hall-effect devices, a limitation on their performance has been the inherently low output voltage and low efficiency of Hall generators. Attempts have been made to develop Hall generators having higher outputs but with only limited success. There are inherent limitations on the efficiency of Hall generators, the maximum power output being estimated at sixteen percent of the input power. As a result, most if not all devices using the Hall-effect require external amplification, in order to increase signal and power levels to usable values. As Hall-effect devices of this type are designed primarily for use in conjunction with aircraft, missiles, and the like, the increased volume and weight required for incorporating the external amplifier presents a problem.

One means employed of reducing the size of components is the development of the molecular electronic block. Such molecular electronic block may have a number of distinct regions or domains, each domain containing semiconductor material of a selected carrier density, said carrier density being determined customarily by control of the type and concentration of selected impurities. The control of impurity type and concentration may be effected by various means, as, alloying, electricochemical action, diffusion, crystallization from a melt, etching, vapor deposition, epitaxial growth, or other means.

This process has been used in the past to produce physically single components which combine the functions normally performed by a multiplicity of physically separate components. Heretofore as far as I am aware, the functions of a Hall-effect generator and one or more stages of electrical amplification have not been successfully combined for use in a commercial device or on an industrial scale.

The invention in its broadest aspects contemplates the use of a thin semi-conductor element, i.e., germanium or silicon crystal having at least four edges and dots of indium on opposed edges thereof, the combination of the indium dots and the germanium or silicon crystal forming a transistor amplifier on opposed edges of the Hall generator.

This combination has particular advantages over the arrangement in which a simple Hall generator would be connected to a remotely-located amplifying module. The importance of these advantages may depend to some degree on the application in which the Hall generator is used, but in general two particular advantages may be cited, namely, reduction in the number of interconnections and reduction in size.

It, therefore, is an object of the present invention to provide a single compact device incorporating an amplifier as an integral part of the Hall generator.

It is another object of the invention to provide a small, compact, Hall generator and amplifier which can be readily manufactured.

With the foregoing and other objects in view, the invention resides in the novel arrangement and combination of parts and in the details of construction hereinafter described and claimed, it being understood that changes in the precise embodiment of the invention herein disclosed may be made within the scope of what is claimed without departing from the spirit of the invention.

Other objects and advantages will become apparent from the following description taken in conjunction with the accompanying drawings in which.

Figure 6:
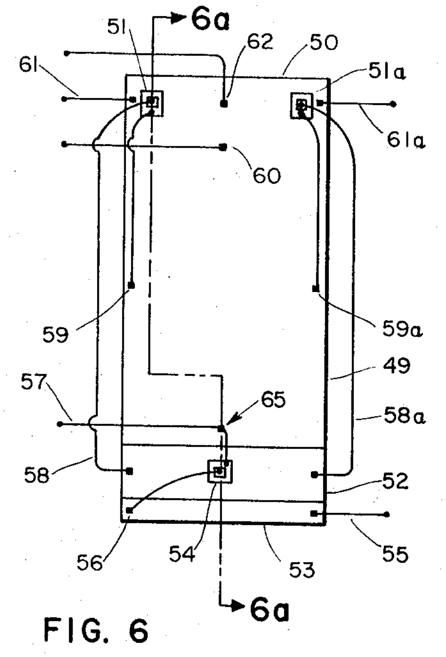
FIGURE 6 is a view of another embodiment of the combined Hall generator and amplifier, having the same schematic circuit as the one shown in FIGURE 2.
Figure 6A:
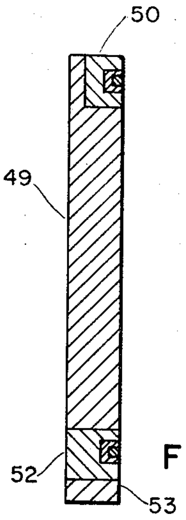

FIGURE 6*a* is a cross-sectional view of FIGURE 6 along the lines 6A—6A thereof.

Generally speaking the present invention contemplates the manufacture of a physically single component combining the functions of a Hall-effect generator and at least one stage of electrical amplification. In one of its particular configurations, the contemplated device includes a nonconducting substrate. Disposed on the substrate is a crystal including an elongated member and two arms providing a cruciform, made of a group IV–A semi-conductor element. The cruciform has a small dot of indium on one side of each arm and a larger dot of indium on the other side of each arm. These indium dots effectively form first and second alloy junction transistors with the semi-conductor item, one dot acting as the emitter, the other dot acting as the collector, and the arms acting as the base.

The substrate has a band of resistive material, a band of conductive material, and first and second collector wires connecting the collectors of said transistors to opposed ends of the bands of resistive material.

A collector supply wire is connected to the middle of said band of resistive material leading off the substrates for connection of the output voltage to an external load.

First and second emitter wires connect the emitters of said transistor to opposed ends of said band of conductive material.

Figure 1:
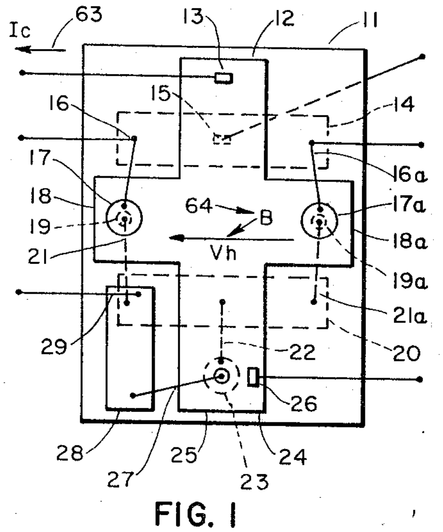
FIGURE 1 is a view of one embodiment of the combined Hall generator and amplifier.

The foregoing arrangement is based upon the fact that where a current $I_c$ is made to pass through a Hall generator 12, such as that shown in FIGURE 1, substantially aligned with the longitudinal axis of the crystal, and the crystal is placed in a magnetic field with the magnetic flux-density vector B passing through the crystal in a direction 64 substantially perpendicular to the plane of the crystal, the magnetic field distorts the current $I_c$ in such a way as to produce a resulting electrical potential gradient which appears across the Hall generator in a direction substantially perpendicular to both the magnetic flux-density vector B and the longitudinal axis of the crystal. The crystal is fabricated in a cruciform configuration, and consequently the potential gradient causes a voltage $V_h$ to appear between the two arms 18 and 18*a*.

The Hall generator is made of N-type germanium. On each of the two arms 18 and 18*a*, a small dot 19 of indium solder is applied to one side, and a larger dot 17 is applied to the other side. These form the emitter 19 and collector 17 of an alloy-junction transistor, the arm 18 or 18*a* constituting the base. In this way the Hall voltage $V_h$ appears directly on the bases of the transistors.

Figure 2:
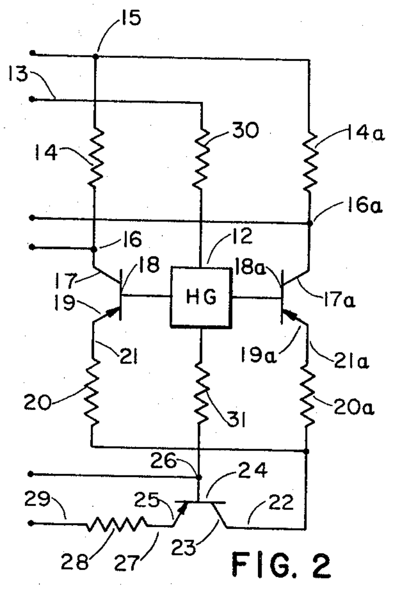
FIGURE 2 is a schematic circuit diagram of the Hall generator and amplifier combination shown in FIGURE 1.

The Hall-generator-amplifier combination lies on a nonconducting substrate 11. A fine wire 16 connects the collector 17 to one end of a band of resistive material 14, which is painted or otherwise deposited on the back of the substrate 11. Another fine wire 16*a* connects the collector 17*a* to the other end of the band 14. This resistive band constitutes the collector resistances of the two transistors, as can be seen in the equivalent circuit diagram in FIGURE 2. Another fine wire 15 is connected to the middle of the resistive band 14 and forms the collector supply. This wire is led off the substrate for connection of the output voltage to the external load.

A wire 21 connects the emitter 19 to one end of a second conductive strip 20, being the same material as 14 but a different object, and similarly a wire 21*a* connects emitter 19*a* to the other end of the same strip. The center of the strip is connected by a wire 22 to a transistor collector 23 located at the extremity 24 of the Hall generator. Indium solder dots form the emitter 25 and collector 23 of a third transistor, the Hall-generator material 24 forming the base. An ohmic contact and wire 26 on the Hall generator form the ground return of the circuit, which is led off the substrate for external connection. The two halves of the resistive band 20 form the emitter resistors of the two transistors, as may be seen from FIGURE 2. The emitter 25 is connected by a wire 27 to a third resistive strip 28, which forms a separate emitter resistor. The other end of this resistor is connected to a wire 29 for external connection.

The transistor 25, 24, 23 is thereby connected in the grounded-base configuration and acts as a high-impedance current source for the differential amplifier formed by the resistors 20, 20*a*, 14, 14*a* and the transistors 19, 18, 17 and 19*a*, 18*a*, 17*a*. The Hall-generator supply is connected to wire 13 and ground lead 26; the amplifier supply is connected to wire 15 and ground lead 26; a bias voltage is applied to wire 29 and ground lead 26; the amplified output voltage appears across output leads 16 and 16*a*. Resistances 30 and 31 are realized by the bulk resistivity and physical dimensions of the arms 12 and 24 of the Hall generator, and ensure that the bases of the transistors 19, 18, 17 and 19*a*, 18*a*, 17*a* are held at the proper quiescent potential.

Figures 3, 4, 5:
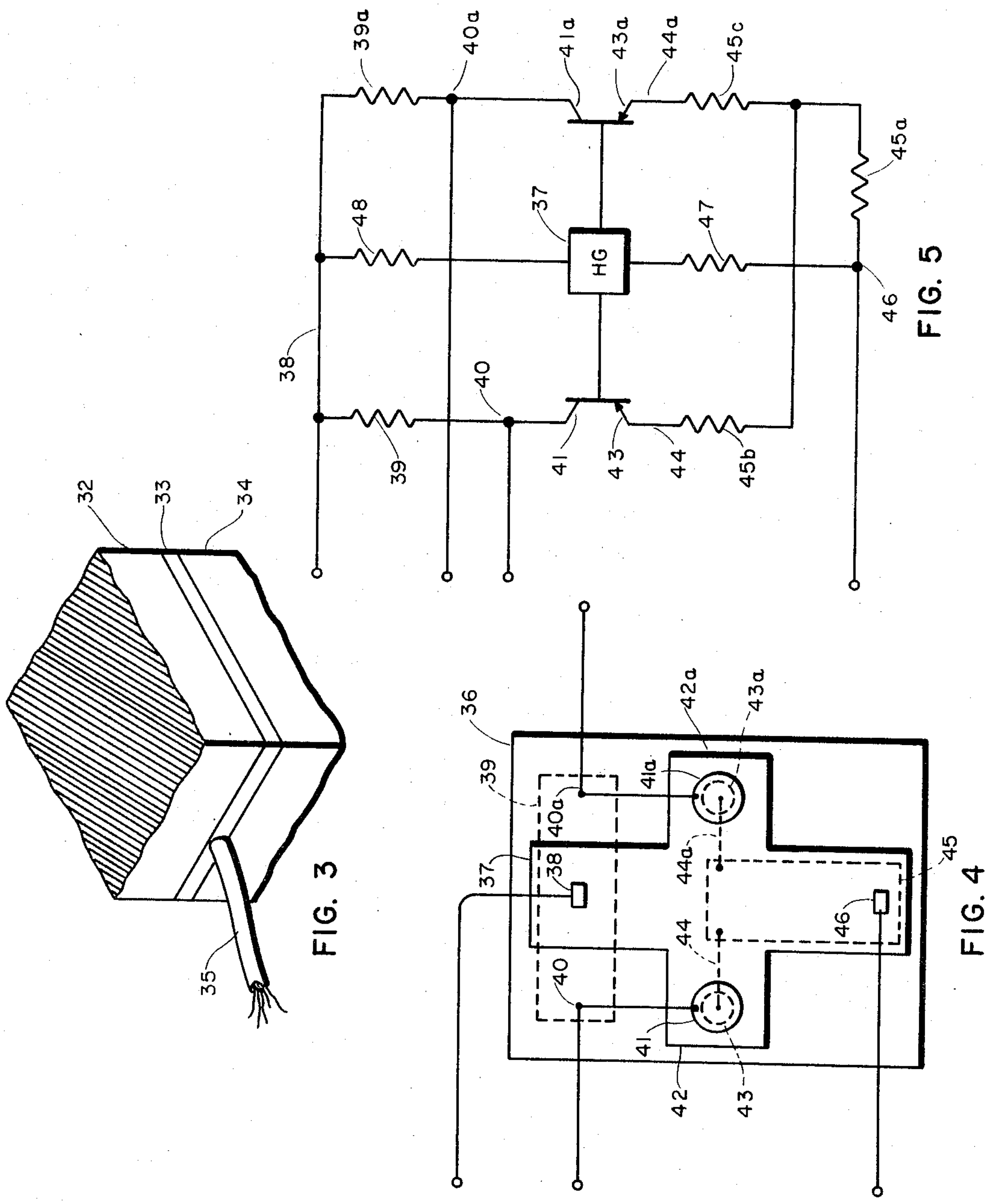
FIGURE 3 is a schematic, modified, perspective view of the Hall generator and amplifier combination shown in FIGURE 1, mounted in the air gap of such a magnetic circuit as might be employed in a typical application.
FIGURE 4 is a view, similar to FIGURE 1, of a modification of the Hall generator and amplifier combination shown in FIGURE 1.
FIGURE 5 is a schematic circuit diagram of the modification shown in FIGURE 4.

One way in which such an embodiment as that of FIGURE 1 might be used in a magnetic circuit is shown in FIGURE 3. The entire Hall-generator-amplifier combination is coated with a protective covering or otherwise encapsulated. The encapsulated module 33 lies between two magnetic pole-pieces 32 and 34. The leads for external connection are passed through a protective flexible tube 35.

A modification of the inventive concept is shown in FIGURE 4. The differential amplifier in this modification is operated without a high-impedance current-supply. Instead, the emitters 43 and 43*a* as shown in the circuit diagram in FIGURE 5 are fed from a common resistor 45*a*. It is possible to form the common resistor 45*a* and the two emitter resistors 45*b* and 45*c* with a single resistive band 45 in FIGURE 4. Since the emitter resistances 45*b* and 45*c* are much smaller than the common resistor 45*a*, the resistances are determined by connecting the emitters 43 and 43*a* through wires 44 and 44*a*, respectively, to one end of the strip, and by connecting the ground return 46 simultaneously to the other end of the strip 45 and the bottom of the Hall generator 37.

In this modification, the Hall generator and the amplifier have a common supply through the wire attached at 38 to the Hall generator 37 and the collector resistances 39. The construction of the remainder of this modification is identical with the construction of the corresponding parts of FIGURE 1.

A second embodiment of the Hall-generator-amplifier combination is shown in FIGURE 6. This device is formed of a single crystal of silicon 49. By means of controlling the impurity concentrations, various regions of this crystal are caused to be N-type or P-type, as shown in the cross-section through 6A—6A, in which the thickness is greatly exaggerated for clarity.

The Hall generator 49 is made of P-type silicon. The Hall-generator supply is connected by ohmic contacts at 60 and 65. The Hall voltage is picked off at ohmic contacts 59 and 59*a*. The constant-current-supply transistor 54 is epitaxially grown in the middle of the N-type region 52. The bulk resistivity of region 52 constitutes the emitter resistors for the epitaxially-grown amplifier transistors 51 and 51*a*. The ends of the region 52 are connected by leads 58 and 58*a* to the emitters of transistors 51 and 51*a*, respectively. These transistors are at the extremities of an N-type region 50. The bulk resistivity and dimensions of this region are so controlled that it constitutes the collector resistances of transistors 51 and 51*a*. The collector supply is connected at ohmic contact 62; wires 61 and 61*a* make the output voltage available externally. The P-type region 53 forms the emitter resistor for transistor 54, to which it is connected by a wire at ohmic contact 56. Wire 55 leads to an externally-applied bias voltage.

Insulation in this device is obtained by suitable juxtaposition of N-type and P-type materials. Thus, for example, region 52 would be typically operated at a positive potential of, perhaps, 2 volts; the potential along region 53 would typically range from −0.5 volt to −5 volts. Thus the interface between regions 52 and 53 forms a reverse-biased diode, and no appreciable conduction is possible between the two regions. In the same manner, region 52 is insulated from region 49 and region 49 from region 50.

The transistors in the embodiment of FIGURE 1 are PNP types; those in the embodiment of FIGURE 6 are NPN types. Otherwise the equivalent circuit of FIGURE 2 applies also to the embodiment of FIGURE 6.

It is observed that the present invention provides a Hall generator amplifier combination which usually requires fewer interconnections depending on where the amplifier output is needed. If the output is to be used in the immediate vicinity of the Hall generator the Hall-generator-amplifier combination may be connected directly to the load with wires of negligible length, whereas a remotely located amplifier will require wires of some length to connect the Hall generator to the amplifier, and additional wires of some length to connect the amplifier to its load.

Furthermore in the invention herein described, it has been considered that these wires are susceptible to any magnetic field which may be in the vicinity, and that spurious signals may be introduced as a result of inductive pickup. To minimize interference from this source, it is desirable to transmit the desired signal at as high a level as can be managed. Therefore, even if the load is located at a distance from the Hall generator, it is desirable to amplify the signal in situ, by means of a Hall-generator-amplifier combination, rather than to risk interference by transmitting the naturally low-level output of the Hall generator alone.

The minimum physical volume an amplifier can have is determined by the amount of power it has to dissipate. Because of the inherent limitations on the efficiency of any amplifier, the amount of power it has to dissipate is proportional to the amount of power it has to deliver to the load. It follows that low-level amplifiers need less volume than high-level amplifiers. With existing construction techniques however, low-level amplifiers consume more space than required by the power dissipation, unless molecular electronic construction is used. This comes about as a result of mounting and interconnection requirements, and of physical tolerances which generally require more space between components. The minimum volume is more closely approached if all the low-level components can be built as a single molecular electronic block. The logical conclusion of this line of reasoning is to build the Hall generator and its associated low-level components as a single unit. In some applications, this may be all that is needed. If a high-level amplifier is required, of such a size that it cannot feasibly be built into a small electronic block, this can be located at a distance from the Hall generator, as it would be in any case, and it will generally be more compact as a result of the exclusion of the low-level stages of amplification.

Moreover, the combination Hall generator and more particularly the combination Hall generator and amplifier, herein described, is useful in conjunction with any of the well-known applications of the Hall-effect, as, brushless rotating shaft components (synchros, tachometers, direct current motors), wattmeters, modulators, sensors, and multipliers, as well as many other applications not specified herein.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed and desired to be protected by United States Letters Patent is:

1. An integrated solid-state circuit component, comprising:
- a Hall crystal of semi-conductive material of one conductivity-type, said crystal having ohmic current electrodes thereon spaced to pass an electric current along a first axis of the crystal and thus generate a Hall voltage output along a second axis transverse to the first;
- a first and a second region of the opposite conductivity-type forming spaced opposed P-N rectifying junctions in said crystal at a location along said transverse axis, thereby defining a transistor in which the material of the Hall crystal constitutes the base region and, consequently, has the Hall output voltage directly impressed on the transistor base region.

2. An integrated solid-state electronic component according to claim 1, including a third and a fourth region of said opposite conductivity-type forming spaced opposed P-N rectifying junctions at a second location along said transverse axis and on the opposite side of said first axis with respect to said first-mentioned location, thereby defining a second transistor in which the material of the Hall crystal constitutes the base region and, consequently, has the Hall output voltage directly impressed on base region of the second transistor.

3. An integrated solid-state electronic component according to claim 2, including a fifth and a sixth region of said opposite conductivity-type and forming spaced opposed P-N rectifying junctions at a third location adjacent one end of said first axis, thereby defining a third transistor in which the material of the Hall crystal constitutes the transistor base region.

4. An integrated solid-state circuit component, comprising:
- an electrically non-conductive substrate;
- a cruciform of semi-conductive material of one conductivity-type on one major surface of said substrate;
- current electrodes making ohmic contact with said cruciform adjacent the ends of one of the legs thereof;
- regions of the opposite conductivity-type forming respective pairs of opposed spaced P-N rectifying junctions with said semi-conductive material adjacent the ends of the other leg of said cruciform, thereby defining adjacent such ends respective transistors in which the material of the cruciform constitutes the transistor base region;
- bands of resistive material on said substrate spaced from one another and from said cruciform; and
- conductor means interconnecting said transistors and bands to define an electronic amplifier circuit for amplifying Hall voltage output on said second leg of the cruciform generated by reason of electric current flow between the current electrodes on the first leg thereof.

5. An integrated solid-state circuit component in accordance with claim 4, wherein said bands of resistive material include a pair of bands on the opposite surface of said substrate from said cruciform and said circuit defining means include:
- conductor means connecting the collector regions of said transistors to opposite ends of one of said pair of resistive bands;
- conductor means connecting the emitter regions of said transistor to one end of the other of said bands;
- conductor means interconnecting the midpoint of said one band and one of said current electrodes; and
- conductor means interconnecting the other end of said other band and the other of said current electrodes.

6. An integrated solid-state circuit component according to claim 4, including:
- additional regions of said opposite conductivity-type forming an additional pair of opposed spaced P–N rectifying junctions with said semi-conductive material adjacent one end of said one leg of the cruciform, thereby defining a third transistor.

7. An integrated solid-state circuit component in accordance with claim 6, wherein said bands of resistive material include a pair of bands on the opposite surface of said substrate from said cruciform and a third band on the same surface of said substrate as said cruciform and said circuit-defining means include:
- conductor means connecting the collector regions of said transistors to opposite ends of one of said pair of resistive bands;
- conductor means connecting the emitter regions of said transistors to the ends of the other of said pair of bands;
- conductor means connecting the midpoint of said other band to the collector region of said third transistor; and
- conductor means connecting the emitter region of said third transistor to one end of said third band.

8. An integrated solid-state circuit component, comprising:
- a single-crystal wafer of semi-conductive material of one conductivity type;
- current electrodes making ohmic contact with said wafer to cause current flow along one axis thereof and thus generate a Hall voltage output along a second axis transverse to said one axis;
- Hall voltage electrodes making ohmic contact with said wafer at locations spaced along said second axis and on opposite sides of said first axis;
- a first transverse region of the opposite conductivity-type extending entirely across one end of said wafer parallel to said second axis;
- a second transverse region of said opposite conductivity-type extending entirely across said wafer adjacent to, but spaced inwardly from, the other end of said wafer and extending parallel to said second axis, said other wafer end constituting a third transverse region and being of said one conductivity-type;
- base and emitter regions respectively of said one and said opposite conductivity-types forming P–N rectifying junctions on said first and second regions defining respective transistors having adjoining portions of said first and second regions as collectors; and circuit means interconnecting said transistor and said ohmic output electrodes to form an amplifier network for the Hall voltage output of said wafer.

9. An integrated solid-state electronic component in accordance with claim 8, wherein the circuit connections are such as to utilize said first region as the collector resistance for the transistor at said one end of the wafer; to utilize said second region as the emitter resistance for the transistor at said one end of the wafer; and to utilize the region of said one conductivity type adjacent said other end of the wafer as the emitter resistance for the transistor adjacent said other end, the respective bulk resistivities of said various transverse regions being preselected to adapt them to function properly as said emitter and collector resistances.

10. An integrated solid-state circuit component, comprising:

a single-crystal wafer of semi-conductive material of one conductivity type;

current electrodes making ohmic contact with said wafer to cause current flow along one axis thereof and thus generate a Hall voltage output along a second axis transverse to said one axis;

Hall voltage electrodes making ohmic contact with said wafer at locations spaced along said second axis and on opposite sides of said first axis;

a first transverse region of the opposite conductivity-type extending entirely across one end of said wafer parallel to said second axis and forming a rectifying P-N junction along its entire interface with said wafer;

a second transverse region of said opposite conductivity-type extending entirely across said wafer adjacent to, but spaced inwardly from, the other end of said wafer and extending parallel to said second axis, said second transverse region forming a rectifying P-N junction along its entire interface with said wafer, said other wafer end being of said one conductivity-type and constituting a third transverse region forming a rectifying P-N junction along its entire interface with said second transverse region;

transistor base regions of said one conductivity-type forming P-N junctions in said first and second transverse regions;

respective transistor emitter regions forming P-N junctions with said base regions, thus defining transistors on said first and second transverse regions having adjoining portions of said first and second transverse regions as collectors; and circuit means interconnecting said transistor and said ohmic output electrodes to from an amplifier network for the Hall voltage output of said wafer.

11. An integrated solid-state electronic component in accordance with claim 10, wherein there are two transistors in said first transverse region located at the respective ends thereof and a single transistor midway between the ends of the second transverse region.

12. An integrated solid-state electronic circuit in accordance with claim 11, including conductor means making electrical connections as follows:

between each said Hall voltage electrode and the base of a respective one of said two transistors;

between each end of said second transverse region and the emitter of a respective one of said two transistors;

between one end of said third transverse region and the emitter of said single transistor; and between the base of said single transistor and one of said current electrodes.

13. An integrated solid-state electronic component in accordance with claim 12, including:

an ohmic contact at the midpoint of said first transverse region for the application of a collector supply voltage;

ohmic contacts on said first transverse region adjacent the ends thereof; and an ohmic contact spaced from said one end of said third transverse region for the application of a bias supply voltage.

14. An integrated solid-state electronic component in accordance with claim 13, wherein the bulk resistivity of said first transverse region is preselected to provide desired collector resistance for said two transistors, the bulk resistivity of said second transverse region is preselected to provide desired emitter resistance for said two transistors, and the bulk resistivity of said third transverse region is preselected to provide desired emitter resistance for said single transistor.

15. An integrated solid-state electronic component in accordance with claim 14, wherein the P-N junctions between the adjoining transverse regions and said wafer are reverse-biased to electrically isolate said wafer and regions.

References Cited by the Examiner

UNITED STATES PATENTS

| | | | |
|---|---|---|---|
| 3,037,199 | 5/1962 | Grant. | |
| 3,050,698 | 8/1962 | Brass | 330—6 |
| 3,221,261 | 11/1965 | Ertel | 307—88.5 |

FOREIGN PATENTS

| | | |
|---|---|---|
| 226,273 | 3/1963 | Austria. |
| 965,949 | 8/1964 | Great Britain. |
| 1,310,428 | 10/1962 | France. |

OTHER REFERENCES

IBM Technical Disclosure Bulletin, Non-destructive Readout for Thin Film Memory, by Coughlin and Williams, p. 71, vol. 3, No. 10. March 1961.

Article by Hubbard et al.: "Microwave Isolator Combines Hall Effect and Tunnel Diodes," Electronics, June 16, 1961, pp. 56, 57.

ROY LAKE, *Primary Examiner.*

N. KAUFMAN, *Assistant Examiner.*